United States Patent
Lo et al.

(10) Patent No.: US 9,362,257 B2
(45) Date of Patent: Jun. 7, 2016

(54) MIRCO-ELECTRO-MECHANICAL SYSTEM MODULE AND MANUFACTURING METHOD THEREOF

(71) Applicants: Chiung-Cheng Lo, Miaoli (TW); Yu-Fu Kang, Taipei (TW); Ning-Yuan Wang, New Taipei (TW); Chiung-Wen Lin, Changhua (TW)

(72) Inventors: Chiung-Cheng Lo, Miaoli (TW); Yu-Fu Kang, Taipei (TW); Ning-Yuan Wang, New Taipei (TW); Chiung-Wen Lin, Changhua (TW)

(73) Assignee: RICHTEK TECHNOLOGY CORPORATION R.O.C., Hsinchu (TW)

( * ) Notice: Subject to any disclaimer, the term of this patent is extended or adjusted under 35 U.S.C. 154(b) by 0 days.

(21) Appl. No.: 14/643,531

(22) Filed: Mar. 10, 2015

(65) Prior Publication Data

US 2015/0259195 A1    Sep. 17, 2015

Related U.S. Application Data

(60) Provisional application No. 61/950,917, filed on Mar. 11, 2014.

(51) Int. Cl.
| | |
|---|---|
| *B81B 7/00* | (2006.01) |
| *B81B 7/02* | (2006.01) |
| *B81C 1/00* | (2006.01) |
| *B81C 3/00* | (2006.01) |
| *H01L 25/00* | (2006.01) |

(52) U.S. Cl.
CPC ............ *H01L 25/00* (2013.01); *B81C 1/00238* (2013.01); *B81C 2203/0792* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 2011/0291283 | A1* | 12/2011 | Chi | ...................... H01L 23/3128 257/773 |
| 2013/0113055 | A1* | 5/2013 | Takano | .................. B81B 7/0054 257/415 |
| 2014/0264808 | A1* | 9/2014 | Wolter | ................. H01L 25/0657 257/678 |

* cited by examiner

*Primary Examiner* — Khaja Ahmad
(74) *Attorney, Agent, or Firm* — Tung & Associates (57) ABSTRACT

The invention provides a micro-electro-mechanical system (MEMS) module, which includes a MEMS die stacked on an electronic circuit die. The electronic circuit die includes a substrate, the substrate including at least one through-silicon via (TSV) penetrating through the substrate; and at least one electronic circuit. The electronic circuit includes a circuit region, and a signal transmission layer directly connecting the TSV. At least one wire is connected between a middle part of the MEMS die and the TSV. There is no signal communication at the interfacing location where the MEMS die is stacked on and bonded with the electronic circuit die.

10 Claims, 7 Drawing Sheets

MIRCO-ELECTRO-MECHANICAL SYSTEM MODULE AND MANUFACTURING METHOD THEREOF

The present invention claims priority to U.S. 61/950,917, filed on Mar. 11, 2014.

BACKGROUND OF THE INVENTION

1. Field of Invention

The present invention relates to a micro-electro-mechanical system (MEMS) module which includes a MEMS die stacked on an electronic circuit die. The electronic circuit communicates with the MEMS device and outside the module through a trough-silicon via (TSV).

2. Description of Related Art

MEMS devices are commonly used nowadays, for sensing motions, pressures, etc. Typical MEMS devices include accelerometers, gyro sensors, altitude sensors, acoustical sensors, etc. The sensed result by a MEMS device is read out by an electronic circuit. In one type of architecture, a MEMS device and an electronic circuit are separately manufactured as two dies and packaged into one MEMS module.

Figure 1:
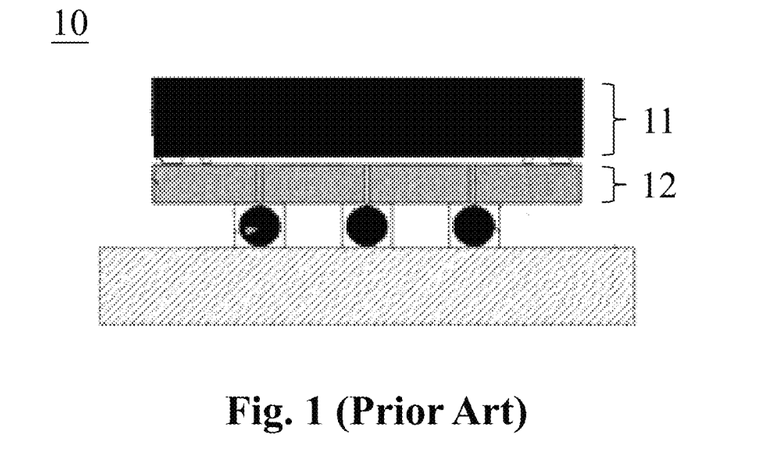
FIG. 1 shows a conventional MEMS module.

FIG. 1 shows a conventional MEMS module, in which a MEMS die 11 is stacked on an electronic circuit die 12. This conventional structure can reduce the size of the package, but it has at least the following drawback: Because the MEMS die 11 communicates with the electronic circuit die 12 at the interfacing location where they are stacked together, it requires high alignment precision between the MEMS die 11 and the electronic circuit die 12.

Figure 2:
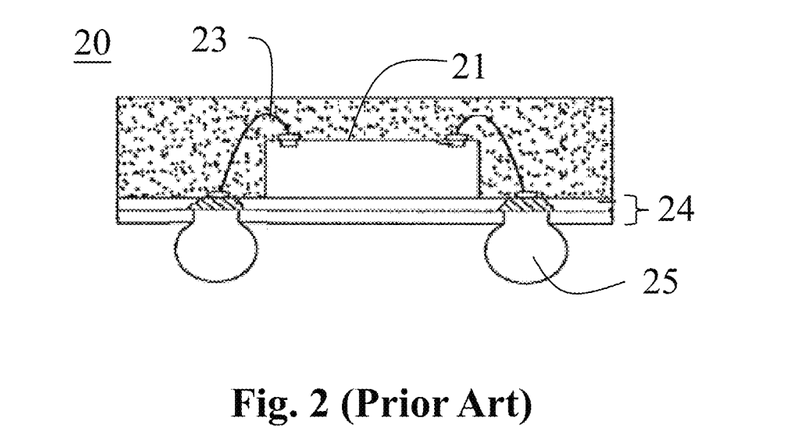
FIG. 2 shows a conventional MEMS package.

FIG. 2 shows a conventional MEMS package 20 which is disclosed by U.S. Pat. No. 8,610,272. The MEMS package 20 includes a MEMS device 21, wirings 23, a bottom package layer 24, and solder balls 24. The MEMS device 21 is electrically connected to the solder balls 24 through the wirings 23, and the solder balls 24 electrically connect the MEMS package 20 to an external electronic circuit (not shown). This conventional structure does not integrate an electronic circuit in the package, so it is required to package the electronic circuit and electrically connect the MEMS package 20 and the packaged electronic circuit; obviously, the total size of two packages is hard to reduce.

Figure 3:
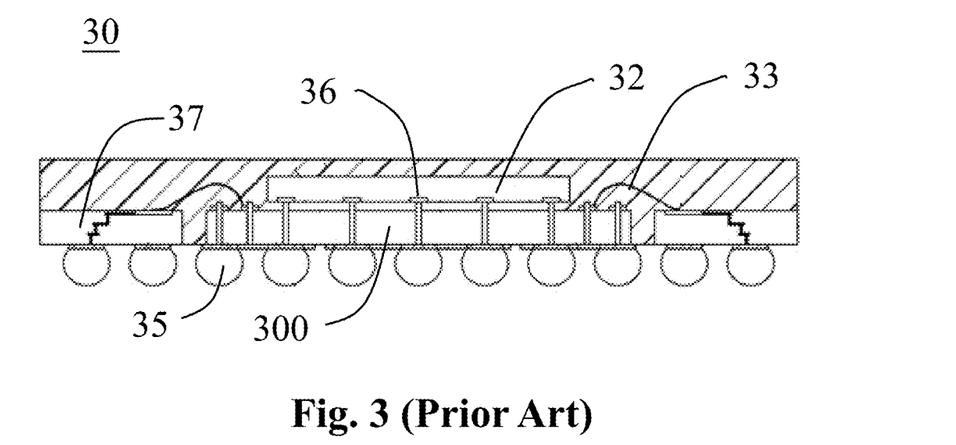
FIG. 3 shows a conventional electronic circuit package.

FIG. 3 shows a conventional electronic circuit package 30. In order to avoid connecting a wiring on top of the circuit device 32 so as not to increase the thickness, the circuit device 32 is connected to a bottom substrate 300 which includes TSVs 36 so that the circuit device 32 can communicate with outside. A number of wirings 33 electrically connect the top of some of the TSVs to other circuit devices 37. In this structure, the circuit devices 37 are located at the lateral sides of the bottom substrate 300, which increases the total area of the package.

Figure 4:
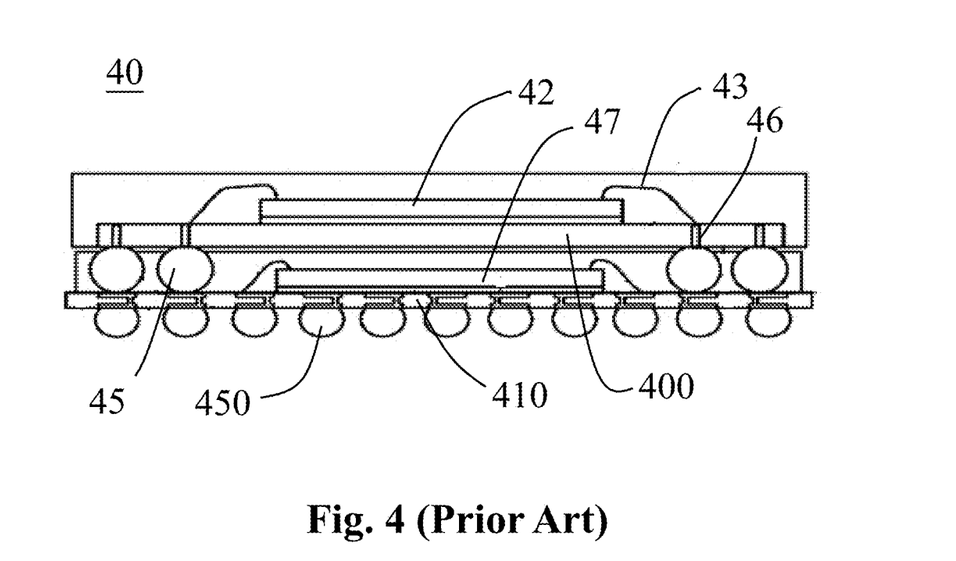
FIG. 4 shows another conventional electronic circuit package.

FIG. 4 shows a conventional electronic circuit package 40. Two circuit devices 42 and 47 are provided, which are respectively electrically connected to bottom substrates 400 and 410 through wirings from top of the circuit devices 42 and 47. The bottom substrate 400 includes TSVs 46. The circuit devices 42 and 47 communicate with each other through solder balls 45; they communicate with outside through solder balls 450. In comparison with the prior art of FIG. 3, the thickness of the electronic circuit package 40 is much larger because of the wiring connecting the top of the circuit device 42.

Furthermore, the prior arts shown in FIGS. 3 and 4 do not explicitly teach packaging a MEMS die and an electronic circuit into one module.

The aforementioned prior arts have the drawback that they do not provide a small size MEMS module with electronic circuit integrated therein, or, if a small size MEMS module is provided, it requires high alignment precision. In view of the above, the present invention provides a small size MEMS module which does not require high alignment precision, to solve the problem of the prior arts.

SUMMARY OF THE INVENTION

In one perspective, the present invention provides a micro-electro-mechanical system (MEMS) module, comprising: a MEMS die and an electronic circuit die, wherein the MEMS die is stacked on and bonded to the electronic circuit die; the electronic circuit die including a substrate, and the substrate including at least one through-silicon via (TSV) and an electronic circuit, wherein the TSV connects an upper surface and a lower surface of the substrate, and the electronic circuit includes a circuit region and a signal transmission layer electrically connected with one the other, wherein the signal transmission layer is directly connected to the TSV; and at least one wiring having one end directly connected to the MEMS die and the other end directly connected to the at least one TSV, wherein the MEMS die and the electronic circuit die do not communicate with each other at the location where the MEMS die and the electronic circuit die are stacked and bonded together.

In one embodiment, the MEMS module further comprises a bottom package layer below the electronic circuit die, wherein the bottom package layer includes at least one contact for connecting a corresponding solder ball.

In one embodiment, the MEMS module further comprises a top package layer which encloses the MEMS die and the wiring, and covers at least a part of the upper surface of the substrate.

In one embodiment, the MEMS die includes a cover which forms a cavity in the MEMS die.

In one embodiment, the MEMS die includes a cover which forms a cavity in the MEMS die, and wherein the top package layer and the cover respectively have openings communicating with one the other such that the cavity is a semi-sealed or open cavity.

In one embodiment, the signal transmission layer is located above the electronic circuit and is relatively closer to the MEMS die, and the signal transmission layer is directly connected to an upper part of the TSV; or, the signal transmission layer is located below the electronic circuit and is relatively closer to a lower side of the electronic circuit die, and the signal transmission layer is directly connected to a lower part of the TSV.

In one embodiment, the substrate of the electronic circuit die includes at least two electronic circuits, and the MEMS module includes at least two MEMS dies and at least two wirings, wherein the at least two MEMS dies communicate with corresponding ones of the electronic circuits through the at least two wirings, respectively.

In one embodiment, the MEMS module further comprises a magnetic material located above or below the signal transmission layer, located above a cover forming an outer housing of the MEMS die, located above a passive component or device included in the MEMS module, or located at the same level as a bottom package layer below the electronic circuit die.

In one embodiment, the at least one wiring is connected to a middle part of the MEMS die and not to a top of the MEMS die.

In one embodiment, the MEMS module is packaged by one of a ball grid array package, pin grid array package, land grid array package, plastic land grid array package, or quad flat no lead package.

From another perspective, the present invention provides a method for manufacturing a MEMS module, comprising: providing a substrate which includes an electronic circuit, and at least one TSV which connects an upper surface and a lower surface of the substrate; providing at least one MEMS die and stacking the MEMS die on and bonding the MEMS die on the substrate, wherein the at least one TSV is exposed; and providing at least one wiring having one end directly connected to the MEMS die and the other end directly connected to the at least one TSV, wherein the MEMS die and the electronic circuit do not communicate with each other at the location where the MEMS die and the substrate are stacked and bonded together.

In one embodiment, the method further comprises: providing a top package layer which encloses the MEMS die and the wiring, and covers at least a part of the upper surface of the substrate.

In one embodiment, the method further comprises: providing a bottom package layer below the electronic circuit die, wherein the bottom package layer includes at least one contact for connecting a corresponding solder ball.

In one embodiment, the at least one wiring is connected to a middle part of the MEMS die and not to a top of the MEMS die.

In one embodiment, the substrate includes at least two electronic circuits, and the step of providing at least one MEMS die provides at least two MEMS dies and the step of providing at least one wiring provides at least two wirings, wherein the at least two MEMS dies communicate with corresponding ones of the electronic circuits through the at least two wirings, respectively.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, to show the interrelations between the components, layers or devices, but not drawn according to actual scale.

Figure 5:
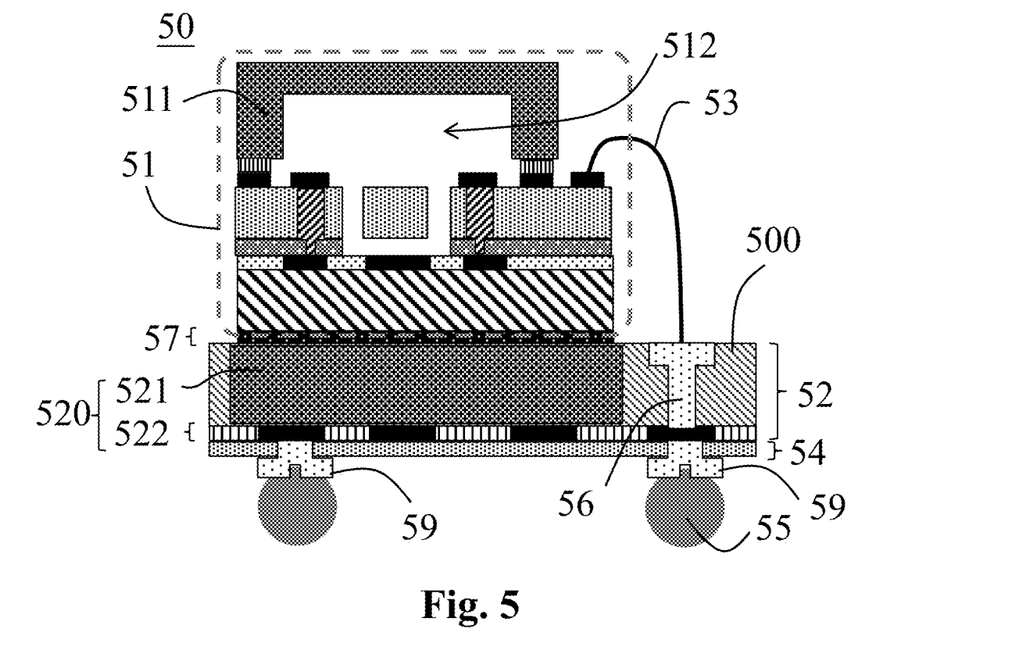
FIG. 5 shows a MEMS module according to one embodiment of the present invention.

FIG. 5 shows a MEMS module 50 according to one embodiment of the present invention. The MEMS module 50 includes a MEMS die 51 and an electronic circuit die 52. The MEMS die 51 is stacked on the electronic circuit die 52, for example but not limited to being bonded by an adhesive layer 57 in between. The electronic circuit die 52 includes a substrate 500, and the substrate 500 includes at least one (preferably plural) through-silicon via (TSV) 56 which connects the upper and lower surfaces of the substrate 500, and an electronic circuit 520 such as an application-specific integrated circuit, ASIC, which can be manufacturing by a CMOS (Complementary Metal-Oxide-Silicon) manufacturing process, a BiCMOS (Bipolar-CMOS) manufacturing process. The electronic circuit 520 includes a circuit region 521 and a signal transmission layer 522 electrically connected with one the other, and the signal transmission layer 522 is directly connected to the TSV 56 (or, from another perspective, it can be regarded as that the signal transmission layer 522 crosses the TSV 56). The MEMS die 51 is electrically connected to the TSV 56 at the upper surface of the substrate 500 by at least one (preferably plural) wiring 53, whereas at the lower surface of the substrate 500, the TSV 56 can communicate with outside of the module for example by, but not limited to, one or more solder balls 55.

It should be noted that the MEMS die 51 and the electronic circuit die 52 does not communicate with each other at the interfacing location where the MEMS die 51 and the electronic circuit die 52 are bonded together (e.g., the location of the adhesive layer 57). Instead, the communication between the MEMS die 51 and the electronic circuit die 52 is achieved by the wiring 53 and the TSV 56, so it is not required for the MEMS die 51 and the electronic circuit die 52 to be accurately aligned with each other. In addition, the wiring 53 is not connected to the top (highest surface) of the MEMS die 51, but instead is connected to a middle part of the MEMS die 51, so the connection by the wiring 53 does not increase the thickness of the module. (The term "middle" is used not in a narrow sense to mean an exact ½ position in the thickness direction, but is used in a broad sense to mean a location between the top and bottom of the MEMS die 51.)

The present invention is not limited to using a ball grid array package with the solder balls 55 as shown in FIG. 5. In other embodiments, the present invention can use pin grid array package, land grid array package, plastic land grid array package, or quad flat no lead package.

In one embodiment, in addition to the MEMS die 51 and the electronic circuit die 52 stacked together, the MEMS module 50 can further include a bottom package layer 54 below the electronic circuit die 52, and the bottom package layer 54 includes contacts 59 at predetermined suitable locations, for connecting the solder balls 55.

Figure 12:
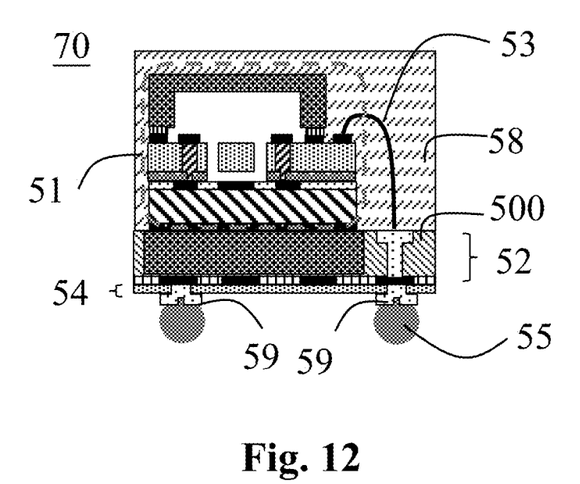
Figure 13:
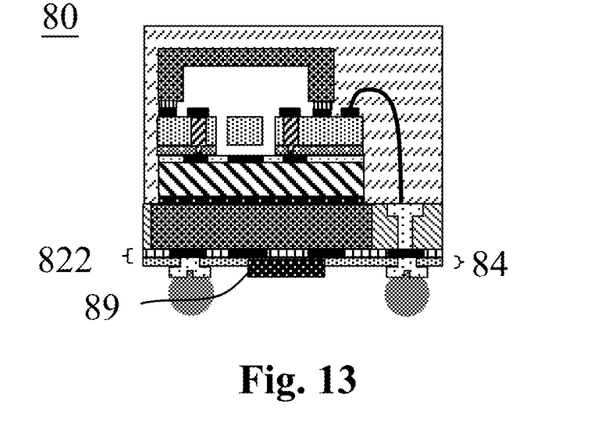
FIGS. 13-18 show MEMS modules according to other embodiments of the present invention.

Referring to FIG. 12, in one embodiment, a MEMS module 70 can further include a top package layer 58 which encloses the MEMS die 51 and the wiring 53, and covers at least a part of the upper surface of the substrate 500.

Referring to FIG. 5, in one embodiment, the MEMS die 51 includes a cover 511 which forms a part of an outer housing of the MEMS die 51, and forms a sealed or semi-sealed cavity 512 in the MEMS die 51, e.g. for sensing pressure.

Figure 6:
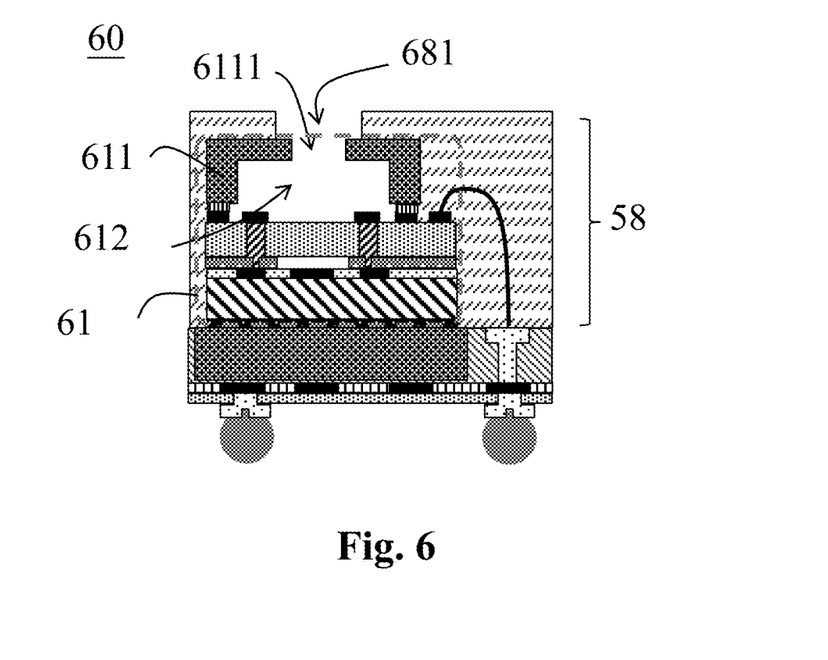
FIG. 6 shows a MEMS module according to another embodiment of the present invention.
Figure 7:
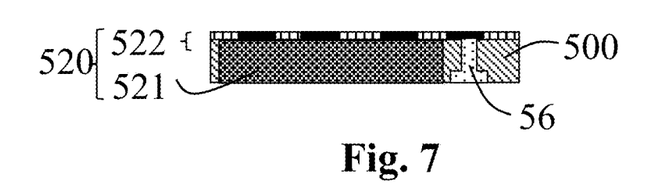
FIGS. 7-12 show steps for manufacturing a MEMS module according to one embodiment of the present invention.
Figure 8:
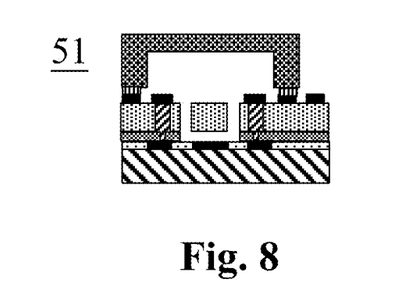
Figure 9:
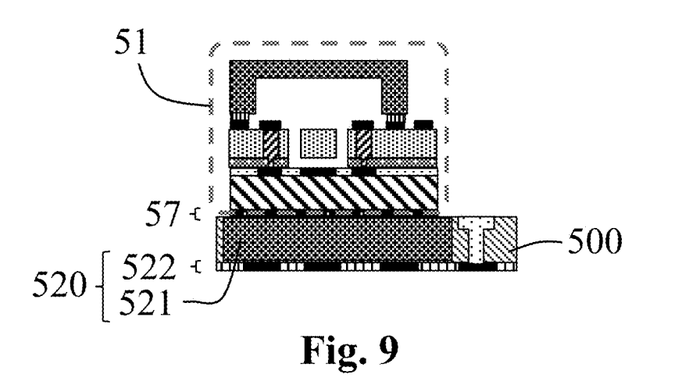

Referring to FIG. 6, in another embodiment, the MEMS die 61 includes a top package layer 58 and a cover 611, which respectively have openings 681 and 6111 communicating with one the other. In this embodiment, the cavity 612 is an open or semi-sealed cavity which can communicate with an external pressure, so that the MEMS module 60 can be designed for a different purpose.

Figure 14:
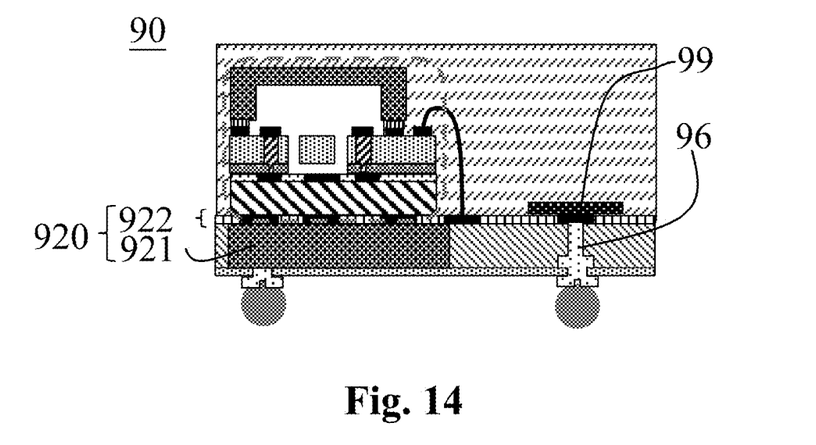
Figure 15:
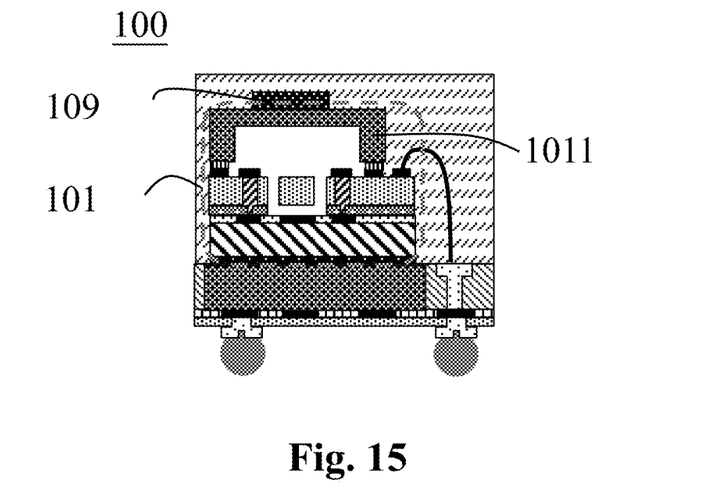

The location of the signal transmission layer can be arranged as desired and is not necessarily located below the circuit region of the electronic circuit. Referring to FIG. 14, in one embodiment, the signal transmission layer 922 in the electronic circuit 920 is located above the circuit region 921, directly connecting the TSV 96 (or, from another perspective, it can be regarded as that the signal transmission layer 522 crosses the TSV 56).

Figure 10:
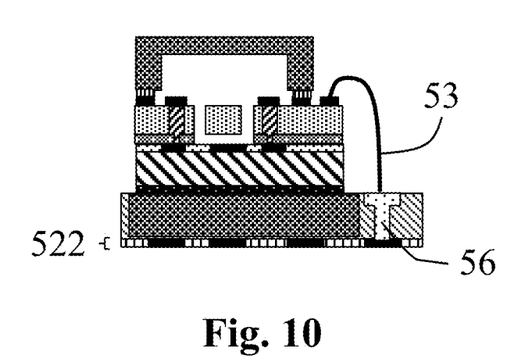
Figure 16:
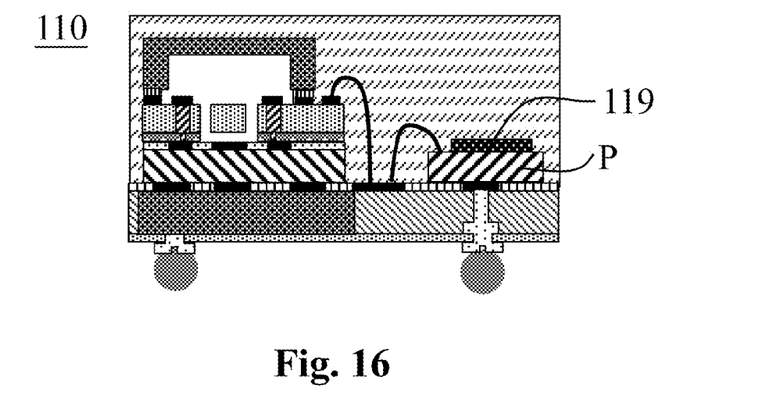

FIGS. 7-12 show steps of a method for manufacturing a MEMS module according to one embodiment of the present invention. The method includes: providing a substrate 500 which includes an electronic circuit 520 and at least one TSV 56 which connects the upper and lower surfaces of the substrate 500, the electronic circuit 520 including a circuit region 521 and a signal transmission layer 522 electrically connected with one the other (FIG. 7); providing a MEMS die 51 (FIG. 8); stacking the MEMS die 51 on and bonding the MEMS die 51 with the substrate 500 by an adhesive layer 57, wherein the at least one TSV 56 is exposed (FIG. 9); and providing at least one wiring 53 which connects the MEMS die 51 to a top side of the TSV 56, wherein the at least one wiring 53 is connected to the MEMS die 51 at a location which is not a top (highest part) of the MEMS die 51 (FIG. 10). The MEMS die 51 and the electronic circuit die 52 (i.e., the MEMS die 51 and the electronic circuit 520 in the electronic circuit die 52) do not communicate with each other at the location where they are stacked and bonded together; instead, they communicate with each other through the wiring 53 and the TSV 56, so it is not required for the MEMS die 51 and the electronic circuit die 52 to be accurately aligned with each other. In this embodiment, the substrate 500 is up-side-down in FIG. 9 as compared with FIG. 7. However, the present invention is not limited to this embodiment; in the embodiments of FIGS. 14 and 16, the substrate 500 is not up-side-down, and whether the substrate 500 should be up-side-down can be arranged according to structure design.

Figure 11:
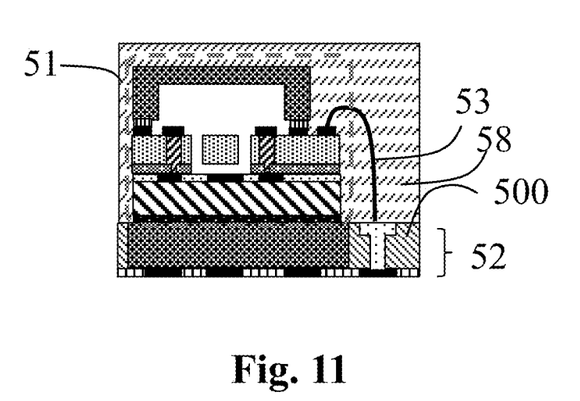

In one embodiment, the method further includes: providing a top package layer 58 which encloses the MEMS die 51 and the wiring 53, and covers at least a part of the upper surface of the substrate 500 (FIG. 11). Further, in one embodiment, the method further includes: providing a bottom package layer 54 which includes plural contacts 59 for connecting plural solder balls 55, to form a chip scale package (FIG. 12).

Referring to the embodiments of FIGS. 13-16, when the MEMS module 80, 90, 100 or 110 is a magnetometer, the MEMS module preferably further includes a magnetic material 89, 99, 109 or 119. The magnetic material can be located at the same level as the bottom package layer 84 or below the signal transmission layer 822 (89, FIG. 13); or, located above the signal transmission layer 922 (99, FIG. 14); or, located above the cover 1011 of the MEMS die 101 (109, FIG. 15); or, located above a passive component or integrated passive device P in the MEMS module (119, FIG. 16).

Figure 17:
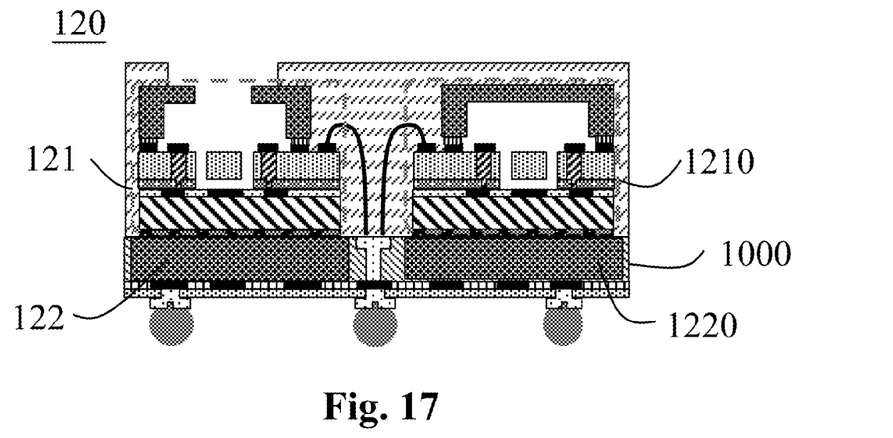
Figure 18:
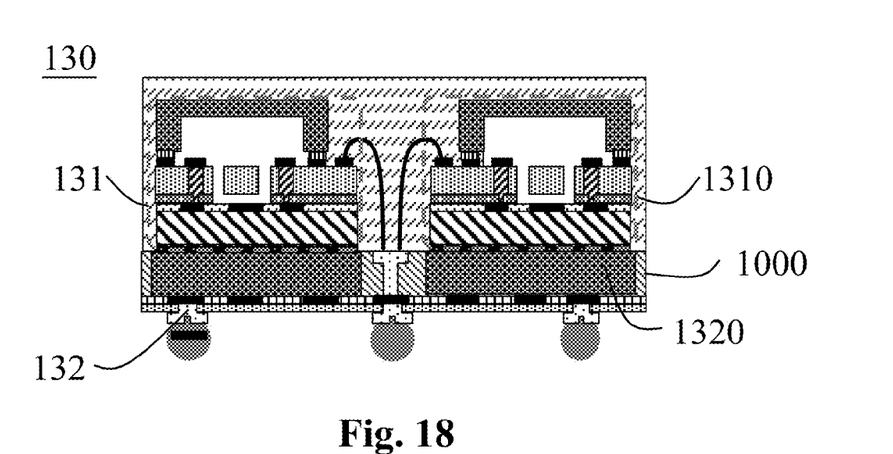

Furthermore, the present invention is not limited to packaging only one MEMS die in the MEMS module as shown in FIGS. 5 and 12-15. Referring to FIGS. 17 and 18, the MEMS module 120 includes two MEMS dies 121 and 1210, and the MEMS module 130 includes two MEMS dies 131 and 1310 (according to the present invention, a MEMS module can include even more than two MEMS dies). The MEMS dies are stacked on a substrate 1000; they communicate with corresponding electronic circuits 122, 1220, 132 and 1320 through wirings and TSVs. (Note that, although the figures show that the wirings are connected to the same TSV, this is only an example but not necessary.) The electronic circuits 122 and 1220 are preferably formed in the same substrate 1000, i.e., one electronic circuit die includes two electronic circuits 122 and 1220. Similarly, the electronic circuits 132 and 1320 are preferably formed in the same substrate 1000, i.e., one electronic circuit die includes two electronic circuits 132 and 1320.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. An embodiment or a claim of the present invention does not need to achieve all the objectives or advantages of the present invention. The title and abstract are provided for assisting searches but not for limiting the scope of the present invention.

What is claimed is:

1. A micro-electro-mechanical system (MEMS) module, comprising:
   a MEMS die and an electronic circuit die, wherein the MEMS die is stacked on and bonded to an upper surface of the electronic circuit die; the electronic circuit die including a substrate having the upper surface and a lower surface, and the substrate including at least one through-silicon via (TSV) and an electronic circuit, wherein the TSV connects the upper surface and the lower surface of the substrate, and the electronic circuit includes a circuit region and a signal transmission layer electrically connected with one another, wherein the signal transmission layer is directly connected to the TSV;
   at least one wiring having one end directly connected to the MEMS die and the other end directly connected to the at least one TSV; and
   a top package layer, enclosing and contacting the MEMS die and the wiring to form an encapsulating enclosure on the upper surface, for covering and contacting the TSV and a part of the upper surface of the substrate, wherein the encapsulating enclosure is formed after the wiring is connected to the TSV and the MEMS die, and the wiring is connected to a middle part of the MEMS die and not to a top of the MEMS die;
   wherein the MEMS die and the electronic circuit die do not communicate with each other at the location where the MEMS die and the electronic circuit die are stacked and bonded together.

2. The MEMS module of claim 1, further comprising a bottom package layer below the electronic circuit die, wherein the bottom package layer includes at least one contact for connecting a corresponding solder ball.

3. The MEMS module of claim 1, wherein the MEMS die includes a cover which forms a cavity in the MEMS die.

4. The MEMS module of claim 1, wherein the MEMS die includes a cover which forms a cavity in the MEMS die, and wherein the top package layer and the cover respectively have openings communicating with one another such that the cavity is a semi-sealed or open cavity.

5. The MEMS module of claim 1, wherein the signal transmission layer is located above the electronic circuit and is relatively closer to the MEMS die, and the signal transmission layer is directly connected to an upper part of the TSV; or, the signal transmission layer is located below the electronic circuit and is relatively closer to a lower side of the electronic circuit die, and the signal transmission layer is directly connected to a lower part of the TSV.

6. The MEMS module of claim 1, wherein the substrate of the electronic circuit die includes at least two electronic circuits, and the MEMS module includes at least two MEMS dies and at least two wirings, wherein the at least two MEMS dies communicate with corresponding ones of the electronic circuits through the at least two wirings, respectively.

7. The MEMS module of claim 1, further comprising a magnetic material located above or below the signal transmission layer, located above a cover forming an outer housing of the MEMS die, located above a passive component or device included in the MEMS module, or located at the same level as a bottom package layer below the electronic circuit die.

8. A method for manufacturing a MEMS module, comprising:
providing a substrate which includes an electronic circuit, and at least one TSV which connects an upper surface and a lower surface of the substrate;
providing at least one MEMS die and stacking the MEMS die on and bonding the MEMS die on the upper surface of the substrate, wherein the at least one TSV is exposed;
providing at least one wiring having one end directly connected to the MEMS die and the other end directly connected to the at least one TSV; and
providing a top package layer which encloses and contacts the MEMS die and the wiring, to form an encapsulating enclosure on the upper surface, for covering and contacting the TSV and a part of the upper surface of the substrate, wherein the encapsulating enclosure is formed after the wiring is connected to the TSV and the MEMS die, and the wiring is connected to a middle part of the MEMS die and not to a top of the MEMS die;
wherein the MEMS die and the electronic circuit do not communicate with each other at the location where the MEMS die and the substrate are stacked and bonded together.

9. The method of claim 8, further comprising: providing a bottom package layer below the electronic circuit die, wherein the bottom package layer includes at least one contact for connecting a corresponding solder ball.

10. The method of claim 8, wherein the substrate includes at least two electronic circuits, and the step of providing at least one MEMS die provides at least two MEMS dies and the step of providing at least one wiring provides at least two wirings, wherein the at least two MEMS dies communicate with corresponding ones of the electronic circuits through the at least two wirings, respectively.

* * * * *